(12) United States Patent
Sun et al.

(10) Patent No.: US 9,917,127 B2
(45) Date of Patent: Mar. 13, 2018

(54) PIXEL ARRANGEMENT

(71) Applicant: Agency for Science, Technology and Research, Singapore (SG)

(72) Inventors: Fei Sun, Singapore (SG); Patrick Guo-Qiang Lo, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 15/318,822

(22) PCT Filed: Jun. 9, 2015

(86) PCT No.: PCT/SG2015/050150
§ 371 (c)(1),
(2) Date: Dec. 14, 2016

(87) PCT Pub. No.: WO2015/199612
PCT Pub. Date: Dec. 30, 2015

(65) Prior Publication Data
US 2017/0117317 A1    Apr. 27, 2017

(30) Foreign Application Priority Data

Jun. 25, 2014  (SG) .......................... 10201403588U

(51) Int. Cl.
*H01L 31/107* (2006.01)
*H01L 27/146* (2006.01)

(52) U.S. Cl.
CPC .. *H01L 27/14636* (2013.01); *H01L 27/14607* (2013.01); *H01L 27/14609* (2013.01); *H01L 31/107* (2013.01)

(58) Field of Classification Search
CPC ......... H01L 27/14636; H01L 27/14607; H01L 27/14609
See application file for complete search history.

(56) References Cited

U.S. PATENT DOCUMENTS 8,461,537 B2  6/2013  Schulz
9,124,833 B2 * 9/2015  Toyoguchi ........ H01L 27/14603
(Continued)

FOREIGN PATENT DOCUMENTS

| WO | 2003019659 A2 | 3/2003 |
| WO | 2003100459 A1 | 12/2003 |
| WO | 2012056036 A2 | 5/2012 |

OTHER PUBLICATIONS

International Preliminary Report on Patentability for International Application No. PCT/SG2015/050150 dated Dec. 27, 2016, pp. 1-5.
(Continued)

*Primary Examiner* — Jamie C Niesz
(74) *Attorney, Agent, or Firm* — Winstead, P.C.

(57) ABSTRACT

According to embodiments of the present invention, a pixel arrangement is provided. The pixel arrangement includes a plurality of pixels arranged adjacent to each other; and a substrate configured to receive the plurality of pixels, wherein each pixel of the plurality of pixels comprises a plurality of optical cells electrically coupled to each other; and an electrical interconnection electrically isolated from the plurality of optical cells, the electrical interconnection arranged to provide electrical communication between two separate conducting terminals external to the pixel.

19 Claims, 13 Drawing Sheets

(56) References Cited

U.S. PATENT DOCUMENTS

| | | | | |
|---|---|---|---|---|
| 9,491,391 | B2* | 11/2016 | Smith | H01L 27/14641 |
| 2002/0180902 | A1* | 12/2002 | Izumi | G02F 1/13336 |
| | | | | 349/43 |
| 2005/0285043 | A1* | 12/2005 | Nascetti | G01T 1/026 |
| | | | | 250/370.09 |
| 2010/0295144 | A1 | 11/2010 | Jackson et al. | |
| 2011/0108702 | A1* | 5/2011 | Jackson | H01L 27/1446 |
| | | | | 250/207 |
| 2012/0188422 | A1* | 7/2012 | Cho | H04N 5/2258 |
| | | | | 348/280 |
| 2013/0161525 | A1 | 6/2013 | Okada et al. | |
| 2016/0295144 | A1* | 10/2016 | Kimura | H01L 27/14603 |
| 2017/0117317 | A1* | 4/2017 | Sun | H01L 27/14636 |

OTHER PUBLICATIONS

Written Opinion of the International Searching Authority for International Application No. PCT/SG2015/050150 dated Sep. 8, 2015, pp. 1-3.

* cited by examiner

≡ Terminal 608 to be shared with other pixels
▨ Independent terminal 606 (not to be shared)
▓ Auxiliary metal line 604, serving as (possible) bypass for the output of neighboring pixels only Terminal 808 to be shared with other pixels
Independent terminal 806 (not to be shared)
Auxiliary metal line 804, serving as (possible) bypass for the output of neighboring pixels only

PIXEL ARRANGEMENT

CROSS-REFERENCE TO RELATED APPLICATION

This application claims the benefit of priority of Singapore patent application No. 10201403588U, filed 25 Jun. 2014, the content of it being hereby incorporated by reference in its entirety for all purposes.

TECHNICAL FIELD

Various embodiments relate to a pixel arrangement.

BACKGROUND

For the past few decades, detectors for single photon detection have been based on photomultiplier tubes (PMTs) as the photodetector of choice. The drawbacks of PMTs typically include relatively high cost, large size and high sensitivity to magnetic fields, in addition to the limited spatial resolution and deadtime effects. To address these drawbacks, the possibility of using compact solid state photodetectors, such as silicon photomultipliers (SiPMs), has been explored. SiPMs have a similar gain to that of PMTs. In addition, SiPMs have a number of advantages over PMTs, such as compactness, low bias voltage operation, magnetic field insensitivity and fast timing response. SiPMs also take advantage of the highly developed Si process technologies and the modern fabrication facilities for batch-processing in semiconductor industry, which provide the robustness and low fabrication costs of the devices. SiPMs have therefore emerged as the photodetector of choice for widespread applications in high-energy physics, fluorescence and luminescence decay measurements, single-molecule detection, laser ranging, nuclear medical imaging like Positron Emission Tomography (PET), radiation detection for homeland security systems, and so on.

FIG. 1 shows a typical layout 100 for a conventional SiPM pixel 102. As can be seen in FIG. 1, hundreds or thousands of microcells 104 are arranged side by side. The cathodes of each microcell are connected together as provided by an electrode 108, and the anodes of each microcell are connected together as provided by an electrode 106. The two electrodes 106,108 shown in FIG. 1 may be connected with adjacent pixels or corresponding readout circuits (not shown in FIG. 1). Although the SiPM pixel 102 is relatively large in size, typically a few millimeters, it only gives one output regarding the light intensity detected in the pixel area. In order to obtain an image showing the light distribution, many SiPM pixels need to be tiled to form a SiPM array.

FIG. 2A shows an image 200 illustrating an example of a commercially available SiPM pixel 202. The pixel 202 is packaged based on surface-mount technology (SMT), so that it may be 4-side tileable. This way, a SiPM array 220 may be flexibly formed by tiles 204 of such SiPM pixels 202, as shown in an image 222 illustrated in FIG. 2B. However, since the SiPM pixel 202 is separately packaged, the area of the active region in a pixel 202 is considerably smaller than the area of a tile 204, because certain amount of the tile area is consumed by the edge 206 of the SMT package. When photons are launched to this edge-consumed area, these photons could not be detected. The ratio between the area of the active region in a SiPM array (the total area of all the microcells in all the pixels) and the area of the array is defined as tile fill factor. The larger the tile fill factor is, the higher the photon detection efficiency would be. Other than the SiPM array tiled by separately packaged SiPM pixels, a few SiPM pixels may also be packaged together to form a module of SiPM arrays.

An example of a 4×4 SiPM array 300 packaged by through-hole technology (THT) is shown a schematic view 302 in FIG. 3. As can be seen in FIG. 3, the sixteen SiPM pixel dies 304 are arranged on a printed circuit board (PCB) or a ceramic cavity with bonding pads 306. The terminals 308 of each pixel 304 are connected to pads 310 by wire-bonding. Since the SiPM pixels 304 are not separately packaged, the tile fill factor of the SiPM array 300 may be increased as compared to the array of FIG. 2B.

FIG. 4 shows an image 400 illustrating an example of a commercially available module of 4×4 SiPM array 402, which is based on the technology shown in FIG. 3. However, the SiPM pixels 304, 404 in FIG. 3 and FIG. 4 are unable to be closely arranged side by side. A gap 312, 406 with certain width is necessary between adjacent pixel dies in order to accommodate the bonding pads and facilitate wire-bonding operation. Thus, there is a need for a more compact tile scheme where the gaps between adjacent pixel dies become unnecessary and the dies may be closely tiled side by side in order to achieve higher tile fill factor and photon detection efficiency, thereby addressing at least the problems mentioned above.

SUMMARY

According to an embodiment, a pixel arrangement is provided. The pixel arrangement may include a plurality of pixels arranged adjacent to each other; and a substrate configured to receive the plurality of pixels, wherein each pixel of the plurality of pixels comprises a plurality of optical cells electrically coupled to each other; and an electrical interconnection electrically isolated from the plurality of optical cells, the electrical interconnection arranged to provide electrical communication between two separate conducting terminals external to the pixel.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1:
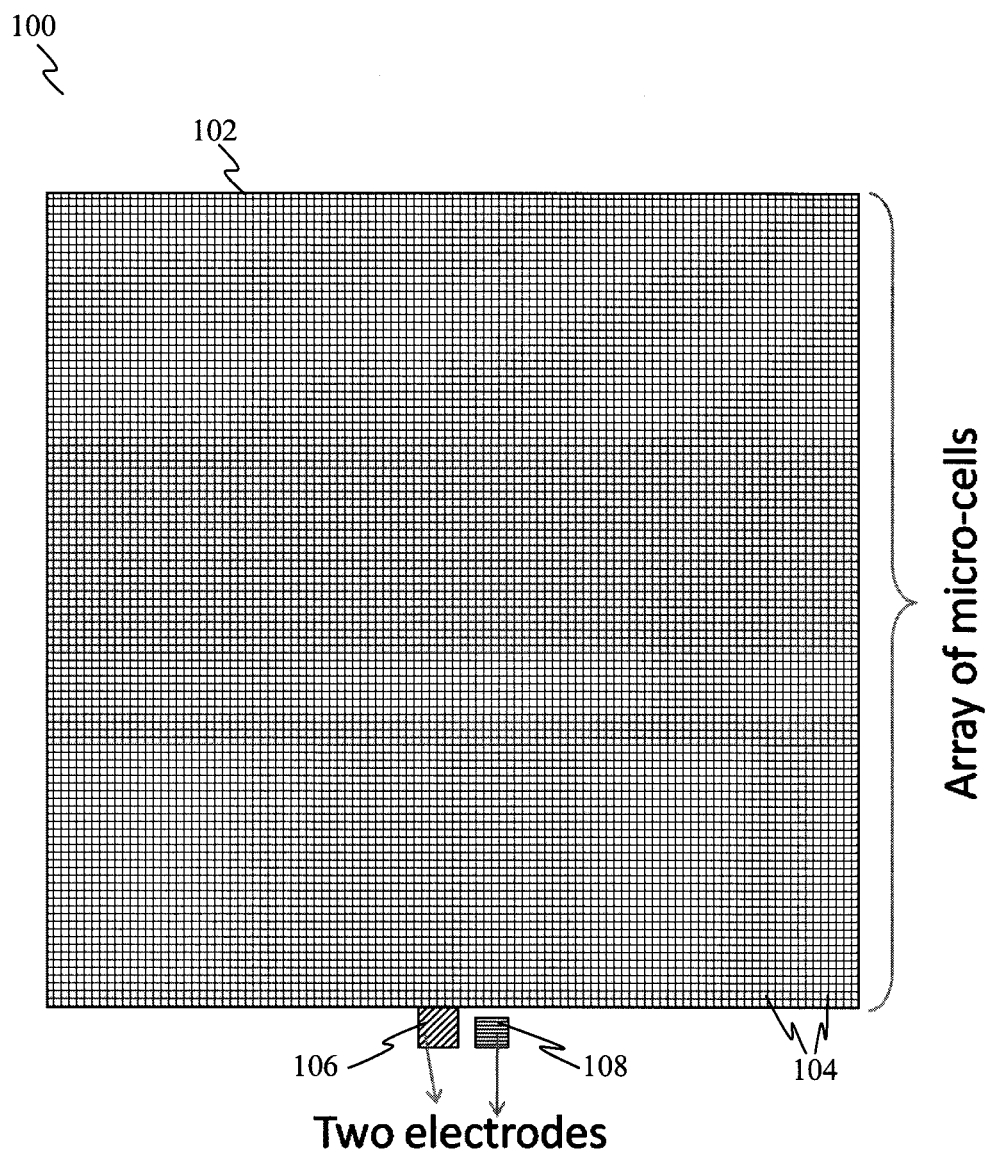
FIG. 1 shows a schematic top view of a typical layout for a conventional SiPM (silicon photomultiplier) pixel.
Figure 2A:
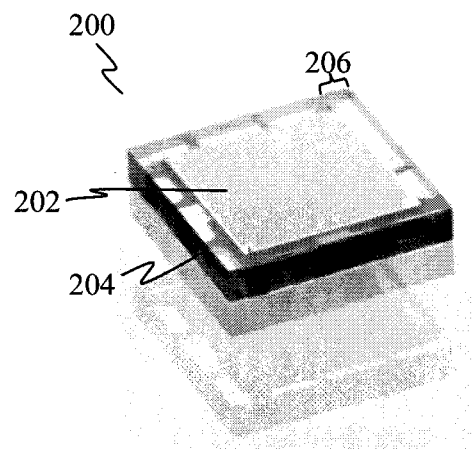
FIG. 2A shows an image illustrating a perspective view of an exemplary commercially available SiPM pixel.
Figure 2B:
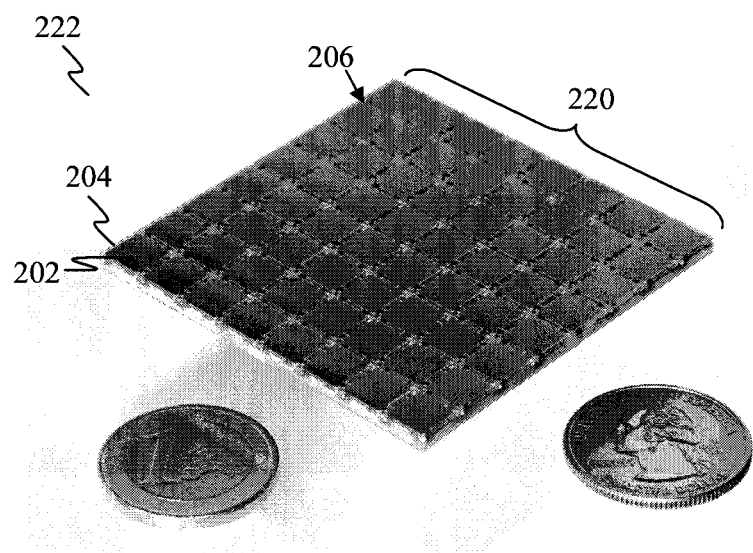
FIG. 2B shows an image illustrating a perspective view of an exemplary SiPM array of SiPM pixels of FIG. 2A.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other methods or devices. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the phrase "at least substantially" may include "exactly" and a reasonable variance.

In the context of various embodiments, the term "about" or "approximately" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments may relate to high quantum efficiency silicon-germanium (GeSi) hetero junction photodetector for 1.064 µm light detection.

Various embodiments may relate to a field of study with respect to Si-CMOS imaging and applications of silicon photomultiplier in medical imaging and biophotonics.

Various embodiments may relate to other applications such as high-energy physics, laser ranging, nuclear medical imaging (positron emission tomography, PET) and radiation detection for homeland security systems.

Various embodiments may provide a silicon photomultiplier array with compactly tiled pixels.

Various embodiments may provide a compactly tile of SiPM (silicon photomultiplier) pixels where easy wire-bonding, high tile factor and high photon detection efficiency may be achieved.

Figure 5A:
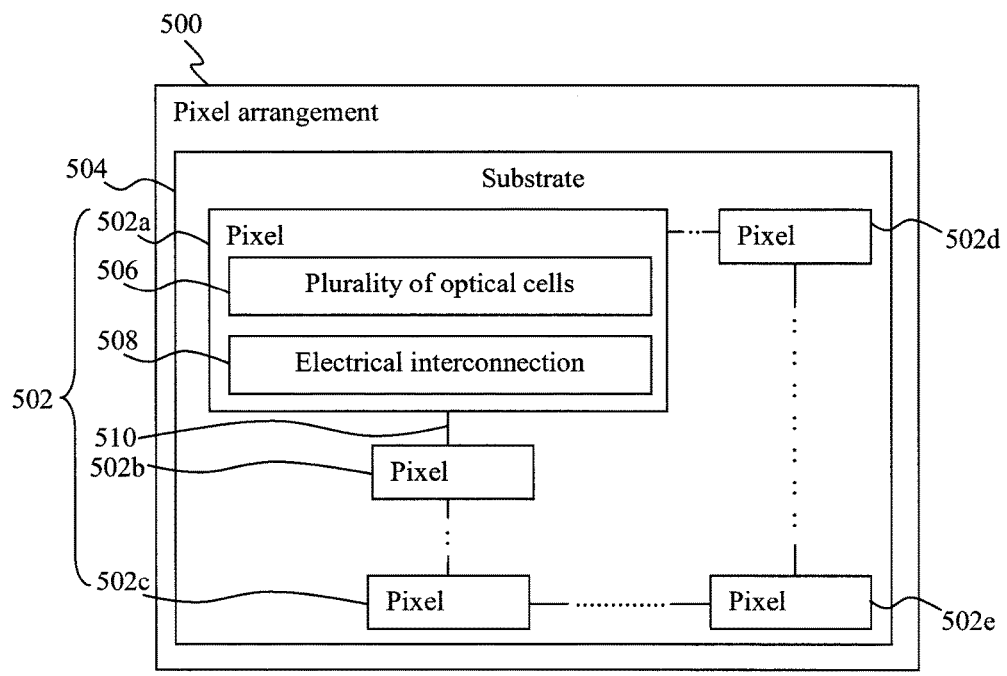
FIG. 5A shows a schematic view of a pixel arrangement, according to various embodiments.

FIG. 5A shows a schematic view of a pixel arrangement 500, according to various embodiments. The pixel arrangement 500 includes a plurality of pixels 502 arranged adjacent to each other; and a substrate 504 configured to receive the plurality of pixels 502, wherein each pixel (for example, pixel 502a) of the plurality of pixels 502 comprises a plurality of optical cells 506 electrically coupled to each other; and an electrical interconnection 508 electrically isolated from the plurality of optical cells 506, the electrical interconnection 508 arranged to provide electrical communication between two separate conducting terminals external to the pixel 502a.

Each pixel (for example, pixel 502a) may be in communication with another pixel (for example, pixel 502b, pixel 502c, pixel 502d or pixel 502e), as denoted by a line 510 which may represent direct electrical coupling, or indirect electrical coupling, or direct physical coupling, or indirect physical coupling between the pixel 502a and the other pixel 502b, 502c, 502d, 502e.

In other words, for each pixel (for example, pixel 502a) of the plurality of pixels 502, the electrical interconnection 508 may be an integrated electrical interconnection arranged with the plurality of optical cells 506 on the pixel 502a. The electrical interconnection 508 may have at least two ends which are on the pixel 502a.

The pixel 502a may include an optical part including the plurality of optical cells 506; and an electrical part including the electrical interconnection 508. The pixel 502a may be capable of allowing an electrical signal from another pixel (for example, 502b, 502c, 502d, 502e) to bypass through via the electrical interconnection 508. This way, the electrical interconnection 508 may be configured to allow wire-bonding to the two separate conducting terminals, which do not form part of the pixel 502a.

Each pixel 502a, 502b, 502c, 502d, 502e may be described in the same or similar context to each other.

In various embodiments, for each pixel (for example, pixel 502a) of the plurality of pixels 502, the electrical interconnection 508 in entirety may be arranged on the pixel 502a.

In various embodiments, each pixel (for example, pixel 502a) of the plurality of pixels 502 may further include a pixel substrate on which the plurality of optical cells 506 are arranged. It should be appreciated that the two separate conducting terminals external to the pixel 502a may be external to the pixel substrate.

In various embodiments, the electrical interconnection 508 may include a planar electrical interconnection arranged on the pixel substrate.

In various embodiments, the plurality of optical cells 506 and the electrical interconnection 508 may be arranged on a same surface of the pixel substrate.

In various embodiments, the substrate 504 may include or may be a chip carrier having at least one conducting pad. The chip carrier having the at least one conducting pad may be configured to receive a wire-bond coupled to a pixel 502a, 502b, 502c, 502d, 502e of the pixel arrangement 500.

In various embodiments, the electrical interconnection 508 of one pixel (for example, pixel 502a) of the plurality of pixels 502 may be electrically coupled to at least one of an electrical interconnection 508 of another pixel (for example, pixel 502b, or pixel 502c, or pixel 502d, or pixel 502e) of the plurality of pixels 502, or an electrode of another pixel (for example, pixel 502b, or pixel 502c, or pixel 502d, or pixel 502e) of the plurality of pixels 502, or the at least one conducting pad of the chip carrier.

For example, the electrical interconnection 508 of one pixel (for example, pixel 502a) of the plurality of pixels 502 may be coupled using wire-bonding to at least one of an electrical interconnection 508 of another pixel (for example, pixel 502b, or pixel 502c, or pixel 502d, or pixel 502e) of the plurality of pixels 502, or an electrode of another pixel (for example, pixel 502b, or pixel 502c, or pixel 502d, or pixel 502e) of the plurality of pixels 502, or the at least one conducting pad of the chip carrier.

In other words, in one example, one separate conducting terminal external to pixel 502a may be a bonding pad of the electrical interconnection 508 of another pixel (for example, pixel 502b, or pixel 502c, or pixel 502d, or pixel 502e), that may be electrically isolated from a plurality of optical cells 506 of the other pixel (for example, pixel 502b, or pixel 502c, or pixel 502d, or pixel 502e), and the other separate conducting terminal external to pixel 502a may be the at least one conducting pad of the chip carrier.

In another example, one separate conducting terminal external to pixel 502a may be a bonding pad of the electrical interconnection 508 of another pixel (for example, pixel 502b, or pixel 502c, or pixel 502d, or pixel 502e), that may be electrically isolated from a plurality of optical cells 506 of the other pixel (for example, pixel 502b, or pixel 502c, or pixel 502d, or pixel 502e), and the other separate conducting terminal external to pixel 502a may be an electrode of the plurality of optical cells 506 of a different pixel (for example, pixel 502b, or pixel 502c, or pixel 502d, or pixel 502e).

In yet another example, one separate conducting terminal external to pixel 502a may be an electrode of a plurality of optical cells 506 of another pixel (for example, pixel 502b, or pixel 502c, or pixel 502d, or pixel 502e), and the other separate conducting terminal external to pixel 502a may be the at least one conducting pad of the chip carrier.

Besides the examples described above, it should be appreciated that the two separate conducting terminals external to pixel 502a may adopt other different combinations.

The electrical interconnection 508 may include a material selected from the group consisting of a metal and an electrically conductive material. For example, the electrical interconnection 508 may be a low-resistivity metal selected from the group consisting of silver, gold, platinum and copper. In other examples, the electrical interconnection 508 may include a doped polysilicon. In fact, the electrical interconnection 508 may be made of a material where the resistivity of the material may be low enough, with no compatibility challenges in device fabrication and process integration for the pixel arrangement 500.

The electrical interconnection 508 may have a width in a range of about 1 μm to about 10 μm. For example, the electrical interconnection 508 may include a (electrical) track having a width in a range of about 1 μm to about 10 μm, or about 5 μm to about 10 μm, or about 1 μm to about 5 μm.

In various embodiments, each pixel 502a, 502b, 502c, 502d, 502e of the plurality of pixels 502 may include a polygon-shaped pixel. For example, the pixel may be of but is not limited to a shape of a square, a rectangle, a triangle, or a pentagon.

In various embodiments, the electrical interconnection 508 may extend along at least two adjacent sides of the polygon-shaped pixel. For example, the electrical interconnection 508 may include a (electrical) track extending along the at least two adjacent sides. This may mean that the electrical interconnection 508 may include a first electrical interconnection portion (or first track portion) extending along a side (e.g., a first side) of the polygon-shaped pixel and a second electrical interconnection portion (or second track portion) extending along an adjacent side (e.g., a second side) of the polygon-shaped pixel. The first track portion and the second track portion may form a continuous track. The first track portion and the second track portion may intersect each other at an intersection point. The first track portion may extend in a first direction (e.g., relative to the intersection point) and the second track portion may extend in a second direction (e.g., relative to the intersection point). The second direction may be different to the first direction, for example, the first and second directions may be perpendicular or orthogonal directions. For example, the first direction may be along a horizontal direction (e.g., x-axis) and the second direction may be along a vertical axis (e.g., y-axis). The first track portion and the second track portion may intersect each other at a corner of the polygon-shaped pixel. The first track portion and the second track portion may intersect each other at least substantially perpendicular (90°) to each other.

In one example, the polygon-shaped pixel may have at least four sides, and the electrical interconnection 508 may extend across at least two adjacent sides, for example, forming an "L"-shaped track/path along the at least two adjacent sides. In other words, the polygon-shaped pixel may be of a square shape. The electrical interconnection 508 extending along each side of the at least two adjacent sides may extend along a part of a length of the side or along the entire length of the side. The electrical interconnection 508 may extend substantially parallel to each side of the at least two adjacent sides. The number of sides along which the electrical interconnection 508 may extend and/or the length of the electrical interconnection 508 extending on each side may depend on the number of pixels used in the pixel arrangement 508. Some exemplary designs of the pixel layout may be described further below, as illustrated in Examples I and II.

In various embodiments, the design/configuration of the pixel arrangement may increase the fill factor of the pixel arrangement (e.g., silicon photomultiplier (SiPM) array). While wire-bonding may reduce the fill factor, the design of various embodiments may enable the gap between adjacent pixels to be reduced more, to increase the fill factor. Where the gap may be greatly reduced, even when the number of wire-bonding increases, the final or effective fill factor of the pixel arrangement or pixel array (e.g., SiPM array) may still be increased.

In various embodiments, the electrical interconnection 508 may include at least two bonding pads. The at least two bonding pads may be configured to facilitate wire-bonds from the electrical interconnection 508. The at least two bonding pads may be arranged at each end of the electrical interconnection 508.

In other embodiments, the electrical interconnection 508 may include a further bonding pad. For example, the further bonding pad may be arranged mid-way of the electrical interconnection 508. In other words, the further bonding pad may be arranged at a position along the electrical interconnection 508, away from the ends of the electrical interconnection 508.

In various embodiments, for each pixel 502a, 502b, 502c, 502d, 502e of the plurality of pixels 502, the electrical interconnection 508 may be spaced apart from the plurality of optical cells 506. In other words, the electrical interconnection 508 may be physically isolated from the plurality of optical cells 506.

For example, the electrical interconnection 508 may be spaced apart from the plurality of optical cells 506 at a distance of about 1 μm to about 10 μm, or about 2 μm to about 10 μm, or about 5 μm to about 10 μm, about 8 μm to about 10 μm.

In various embodiments, each pixel 502a, 502b, 502c, 502d, 502e of the plurality of pixels 502 may further include a first electrode electrically coupled to one end of each of the plurality of optical cells 506, and a second electrode electrically coupled to the opposite end of each of the plurality of optical cells 506. The first and the second electrodes may be arranged on the pixel substrate. The first electrode and the second electrode may be arranged away from the electrical interconnection 508. For example, the first electrode and the second electrode may be arranged on at least one side of a pixel 502a, 502b, 502c, 502d, 502e that may be different from a side along which the electrical interconnection 508 extends. In other words, the first and second electrodes may be arranged along or at sides of a polygon-shaped pixel that are different from the sides along which the electrical interconnection extends.

In various embodiments, the plurality of optical cells 506 may be electrically coupled to each other in parallel. Each of the plurality of optical cells 506 may include an avalanche photo diode (APD) and a quenching resistor. The APD may be arranged in series to the quenching resistor. Each pixel 502a, 502b, 502c, 502d, 502e of the plurality of pixels 502 may include a SiPM (silicon photomultiplier) pixel.

Figure 5B:
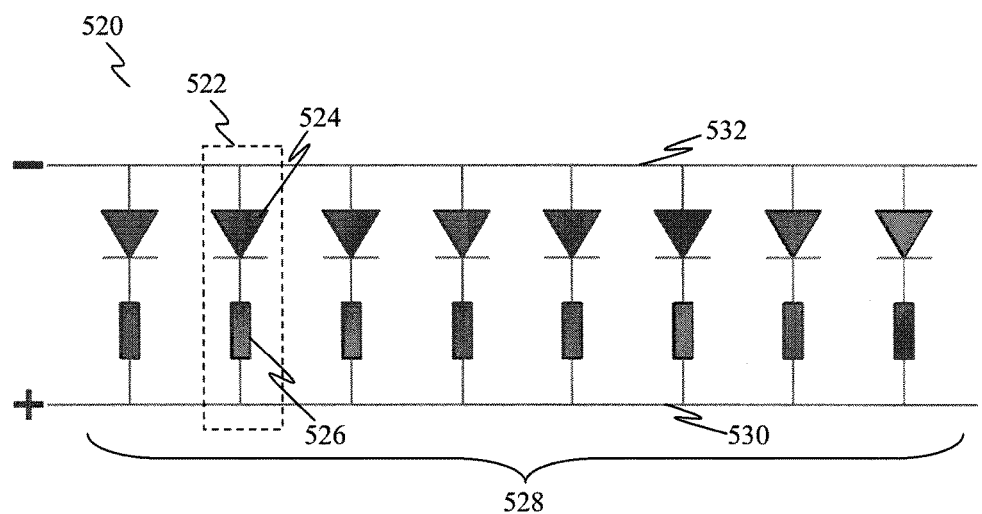
FIG. 5B shows a schematic diagram illustrating an arrangement of optical cells of a pixel of the pixel arrangement of FIG. 5A.

A SiPM pixel is a two-terminal device made of large numbers of identical microcells (for example, optical cells 506) connected to each other in parallel. As described above, each microcell 522 may be formed by an APD 524 and a quenching resistor 526, as shown in a schematic diagram 520 of FIG. 5B. When a light is launched to a SiPM pixel 528, photons at different locations may be detected by corresponding APDs 524 in the form of amplified avalanche currents. In spite of the fact that the APDs 524 may be working in Geiger mode, the SiPM pixel 528 may still be expected to be an analog device to quantitatively measure the intensity of the incident light. In order for that to be achieved, a resistor 526 in series with the APD 524 may be necessary to control the current and the power consumption of the diode 524. The output of a SiPM pixel 528 may be the analogue sum of the currents from each cell 522, corresponding to the intensity of the incident light. Furthermore, the resistor 526 may also be used to quench the avalanche current and turn off the fired diode 524, so as to allow it to get ready for detection of another incident photon.

For example, the first electrode may include a cathode terminal 530 (e.g., a terminal towards to a cathode of the APD 524) and the second electrode may include an anode terminal 532 (e.g., a terminal towards to an anode of the APD 524).

In various embodiments, the pixel arrangement 500 may be an N×N array.

In other embodiments, the pixel arrangement 500 may be an M×N array (M≠N).

The plurality of pixels 502 may be in a side-by-side arrangement. In other words, the plurality of pixels 502 may be in a tile arrangement.

In various embodiments, each pixel (for example, pixel 502a) of the plurality of pixels 502 may have at least one side in contact with at least one side of a neighbouring pixel (for example, pixel 502b) of the plurality of pixels 502.

Each pixel 502a of the plurality of pixels 502 and a neighbouring pixel 502b of the plurality of pixels 502 may be spaced apart from each other with a gap of less than 0.1 μm, or less than 0.5 μm, or less than 1 μm.

In various embodiments, each pixel 502a of the plurality of pixels 502 and a neighbouring pixel 502b of the plurality of pixels 502 may be of different orientations with respect to each other. For example, this may mean that the pixel 502a and the neighbouring pixel 502b may have respective electrical interconnections 508 arranged in different orientations with respect to each other. The electrical interconnections 508 of the pixel 502a and the neighbouring pixel 502b may each have a first electrical interconnection portion (or first track portion) and a second electrical interconnection portion (or second track portion) intersecting each other at a respective intersection point. Each first electrical interconnection portion may extend in a first direction (e.g., along a horizontal direction/axis, e.g., x-axis) and each second electrical interconnection portion may extend in a second direction (e.g., along a vertical direction/axis, e.g., y-axis). As non-limiting examples, the respective first electrical interconnection portions of the pixel 502a and the neighbouring pixel 502b may extend (relative to their respective intersection point) in the same direction while their respective second electrical interconnection portions may extend (relative to their respective intersection point) in opposite directions, or the respective second electrical interconnection portions of the pixel 502a and the neighbouring pixel 502b may extend (relative to their respective intersection point) in the same direction while their respective first electrical interconnection portions may extend (relative to their respective intersection point) in opposite directions, or the respective first electrical interconnection portions of the pixel 502a and the neighbouring pixel 502b may extend (relative to their respective intersection point) in opposite directions while their respective second electrical interconnection portions may also extend (relative to their respective intersection point) in opposite directions. Therefore, this may mean that the first electrical interconnection portion and the second electrical interconnection portion of the pixel 502a may intersect each other at a first corner of the pixel 502a (e.g., lower right corner of the pixel 502a) while the first electrical interconnection portion and the second electrical interconnection portion of the neighbouring pixel 502b may intersect each other at a second (different) corner of the neighbouring pixel 502b (e.g., lower left corner of the neighbouring pixel 502b). Further, this may mean that the respective electrical interconnections 508 of the pixel 502a and the neighbouring pixel 502b may form respective different "L"-shaped track/path configuration.

In the context of various embodiments, the pixel arrangement 500 may be or may include a SiPM (silicon photomultiplier) array.

In order to eliminate or at least minimize the gaps between adjacent pixels, the output of each pixel may be read out from the edge of the SiPM array module (e.g., the pixel arrangement 500 of FIG. 5A). Pixels locating at the edge of the array may be read-out directly by wire-bonding with the pads around the SiPM array. For the pixels locating at center (or middle part) of the array, auxiliary metal lines may be introduced in the SiPM pixel layout to facilitate the respective read-outs. Examples of SiPM arrays, in accordance with various embodiments will now be described in detail as follow.

Example I describes a 4×4 SiPM array, in accordance with one embodiment.

Figure 6:
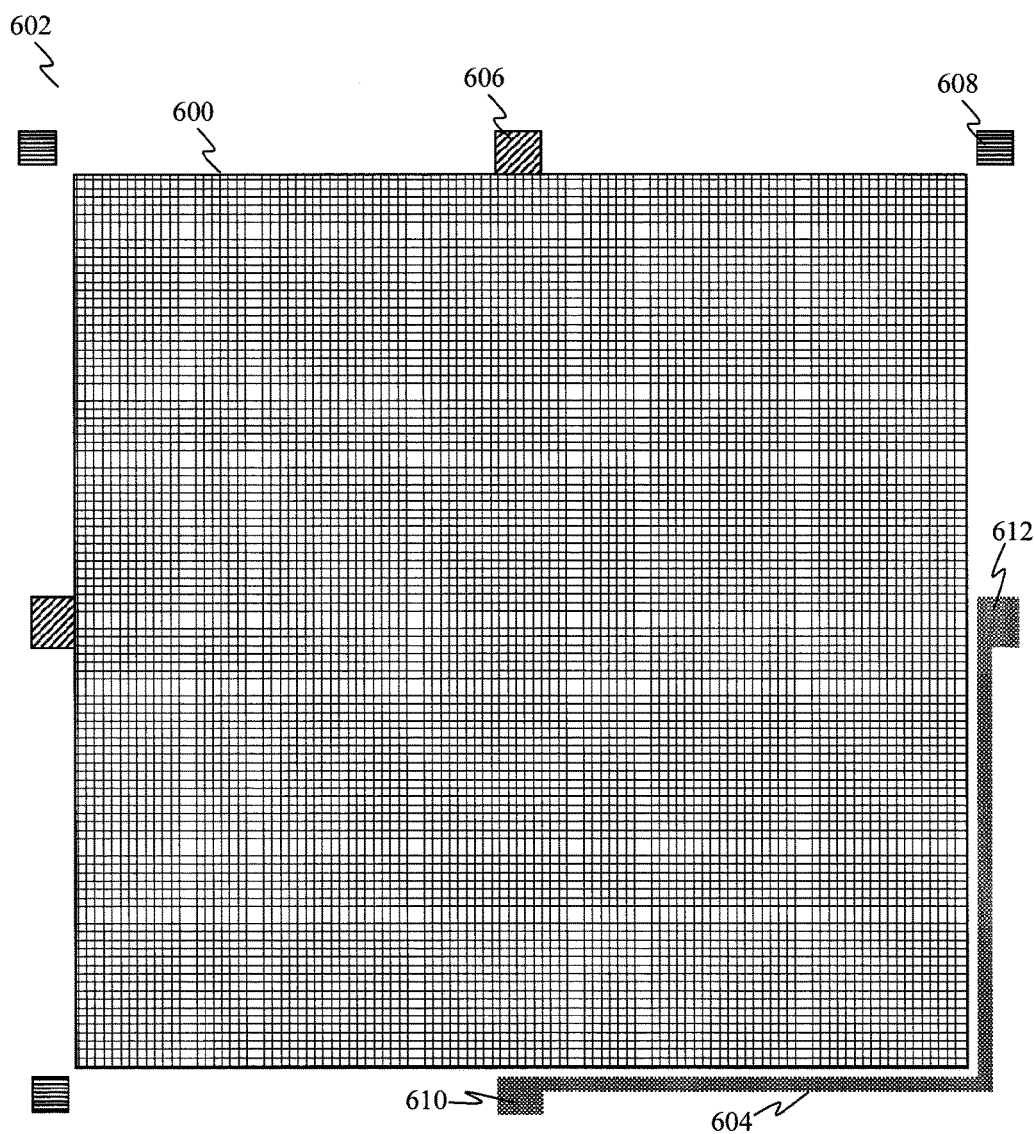
FIG. 6 shows a schematic top view of a SiPM pixel, according to one embodiment.

In Example I, a layout 602 of a SiPM pixel 600 for a 4×4 SiPM array (not shown) is shown schematically in FIG. 6. As can be seen in FIG. 6, more electrodes (both anodes 606 and cathodes 608) may be introduced for flexible connection with adjacent pixels. In spite of that, the SiPM pixel 600 shown is still a two-terminal device, since all the anodes 606 are electrically identical, so are all the cathodes 608. The anodes 606 and the cathodes 608 may include bonding pads for coupling to, for example, the bonding pads on an underlying chip carrier (not shown in FIG. 6). As can be also seen from FIG. 6, an auxiliary metal line 604 with two bonding pads 610, 612 at two ends is introduced. This auxiliary metal line 604 may be electrically isolated from the SiPM pixel 600 itself. The auxiliary metal line 604 may only serve as a bypass for the read-out of adjacent pixels (not shown in FIG. 6). The auxiliary metal line 604 may extend mid-way along a side of the SiPM pixel 600 from the bonding pad 610 toward a corner/edge of the SiPM pixel 600, and may then continue to extend mid-way along another side of the SiPM pixel 600 from the corner/edge of the SiPM pixel 600 toward the bonding pad 612.

The SiPM pixel 600 of FIG. 6 may include the same or like elements or components as those of a pixel 502 of the pixel arrangement 500 of FIG. 5A, and as such, the like elements may be as described in the context of the pixel 502 of the pixel arrangement 500 of FIG. 5A, and therefore the corresponding descriptions are omitted here. For example, the auxiliary metal line 604 may be described in the same or similar context with the electrical interconnection 508 of FIG. 5A.

Figure 7A:
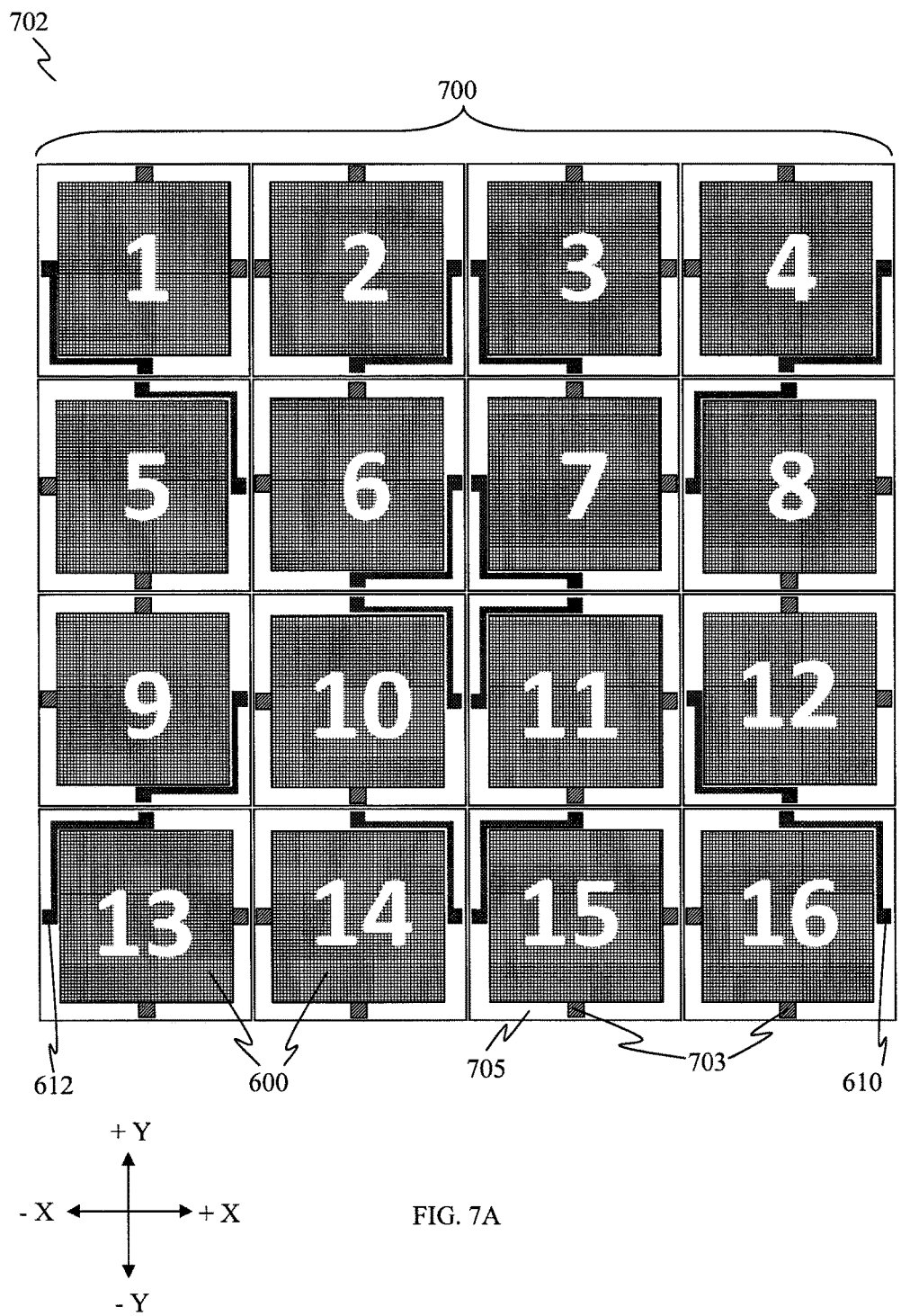
FIG. 7A shows a schematic top view of an arrangement of SiPM pixels of FIG. 6.

When used to form a 4×4 SiPM array/arrangement 700, the sixteen pixels (e.g., each being the SiPM pixel 600) may be arranged closely side by side, but with different orientations from each other, as shown in a schematic top view 702 of FIG. 7A. The signal of the sixteen pixels 600 may be read out by wire-bonding between the bonding pads 703, 610, 612 on the dies 705 and the bonding pads on an underlying chip carrier (not shown in FIG. 7A). All the pixels 600 in the array 700 have independent readout signals while sharing the same ground (GND).

Figure 7B:
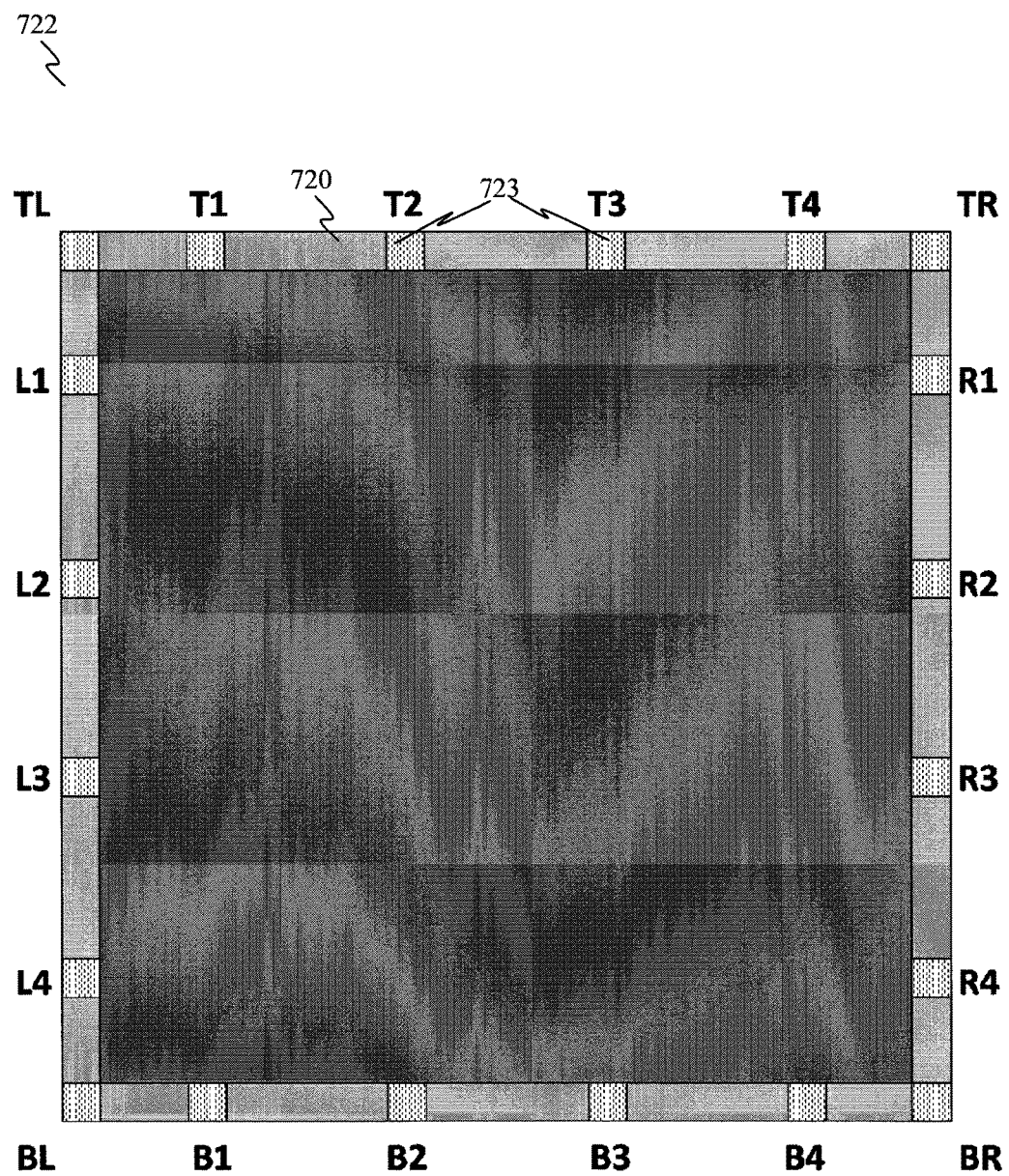
FIG. 7B shows a schematic top view of a chip carrier, according to one embodiment.

The arrangement of bonding pads 723 on a chip carrier 720 is shown in a schematic top view 722 of FIG. 7B. As can be seen in FIG. 7B, there may be twenty bonding pads 723 in total (TL, T1-T4, TR, R1-R4, BR, B1-B4, BL, L1-L4), where four of which may serve as ground and may be shared by all the pixels.

Figure 7C:
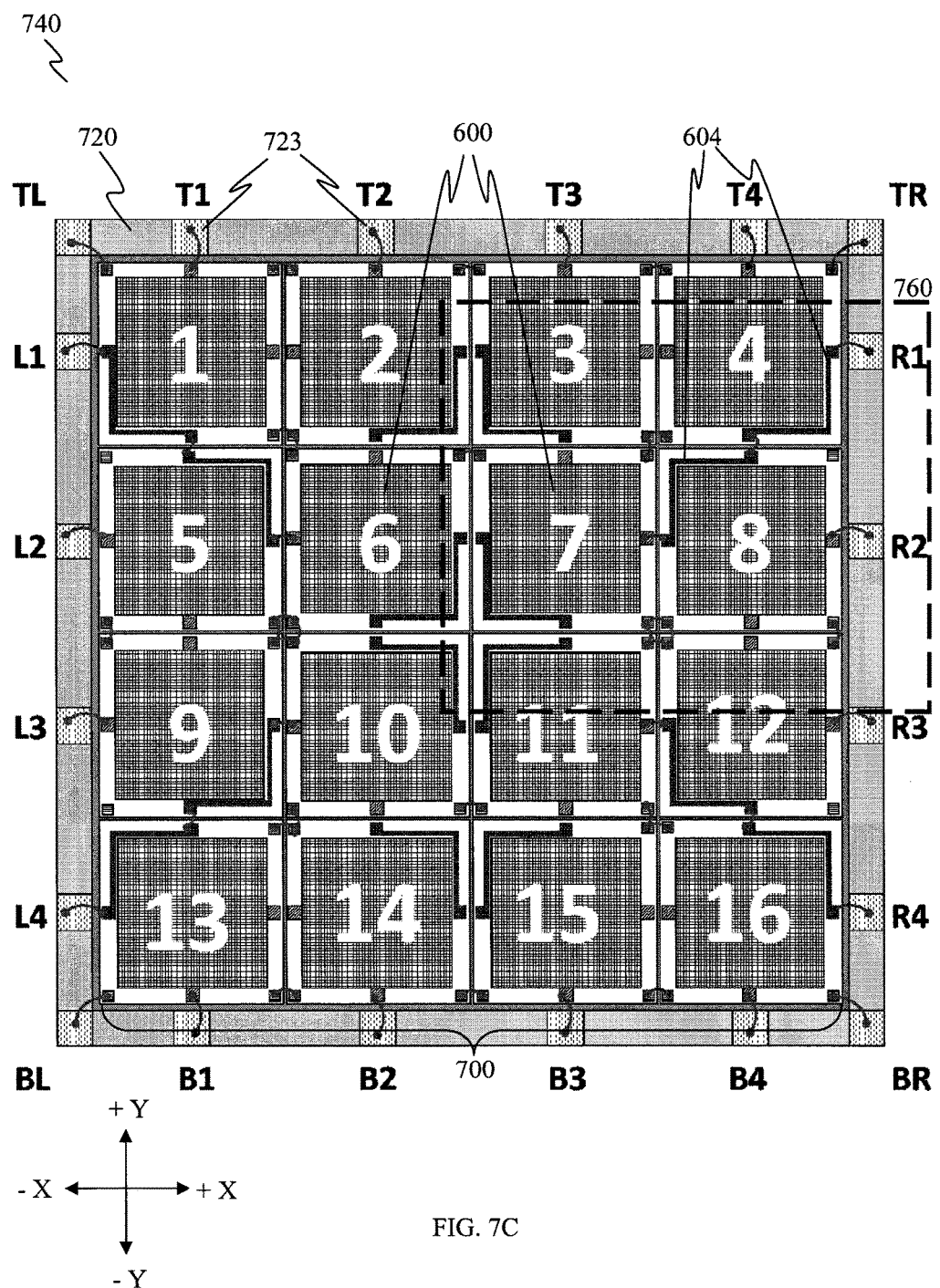
FIG. 7C shows a schematic top view of a packaged 4×4 SiPM array, according to one embodiment.

After wire-bonding, a schematic top view 740 of the packaged 4×4 SiPM array 700 is shown in FIG. 7C. The SiPM array 700 of FIG. 7C may include the same or like elements or components as those of the pixel arrangement 500 of FIG. 5A, and as such, the like elements may be as described in the context of the pixel arrangement 500 of FIG. 5A, and therefore the corresponding descriptions are omitted here.

As can be seen in FIG. 7C, the pixels 600 at the center of the array 700 (e.g., pixels numbered "6", "7", "10", and "11") may be read out by means of the auxiliary metal lines 604 in adjacent pixel dies. All the other pixels at the edges of the array 700 (pixels numbered "1" to "4", "8", "12", "13" to "16", "9" and "5") may be readout by direct wire-bonding with the adjacent pads 723 on the chip carrier 720 (FIG. 7C).

Figure 7D:
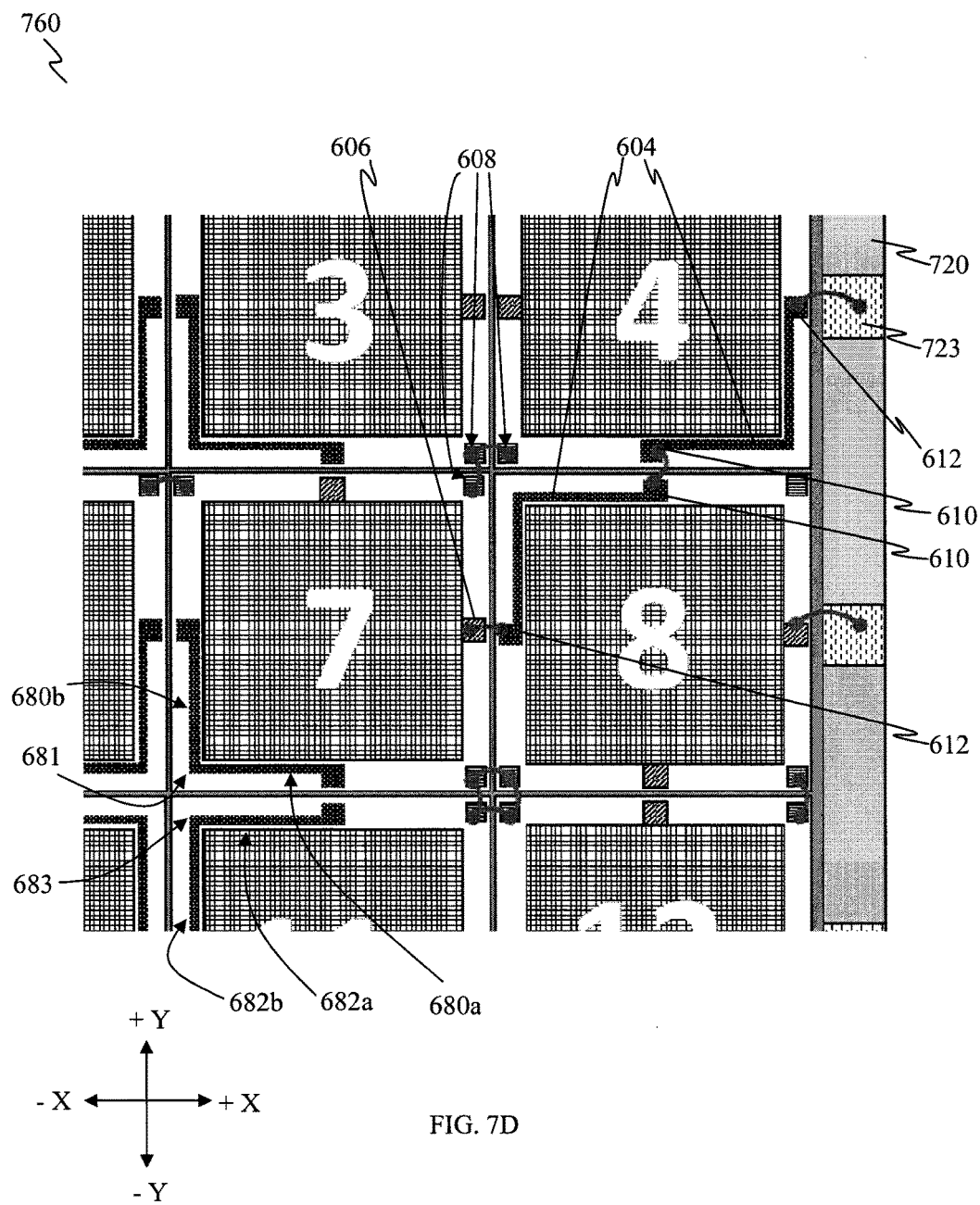
FIG. 7D shows an expanded view of a part of the packaged 4×4 SiPM array of FIG. 7C, as indicated by a dashed rectangle 70 in FIG. 7C.

For example, to facilitate the read-out of pixel numbered "7" as shown in an expanded view 760 of FIG. 7D, corresponding to a part indicated by a dashed rectangle 760 in FIG. 7C, the bonding pad of anode 606 of pixel numbered "7" may be coupled using wire-bonding to the bonding pad 612 of the auxiliary metal line 604 of the pixel numbered "8", and the bonding pad 610 of the auxiliary metal line 604 of the pixel numbered "8" may be coupled using wire-bonding to the bonding pad 610 of the auxiliary metal line 604 of the pixel numbered "4", and the bonding pad 612 of the auxiliary metal line 604 of the pixel numbered "4" may be coupled using wire-bonding to the bonding pad 723 (R1) of the underlying chip carrier 720. The cathodes 608 of the pixels numbered "3", "7" and "8" may be wire-bound together.

As shown in FIG. 7D, using the pixel numbered "7" as a non-limiting example, the auxiliary metal line 604 of the pixel numbered "7" may include a first electrical interconnection portion (or first track portion) 680a and a second electrical interconnection portion (or second track portion) 680b intersecting each other at an intersection point 681. The first electrical interconnection portion 680a and the second electrical interconnection portion 680b may intersect at a lower left corner of the pixel numbered "7". The first electrical interconnection portion 680a and the second electrical interconnection portion 680b may intersect each other at least substantially perpendicular (90°) to each other. The first electrical interconnection portion 680a may extend along one side of the pixel numbered "7", along the x-axis in the +x-direction (relative to the intersection point 681), while the second electrical interconnection portion 680b may extend along another side (adjacent side) of the pixel numbered "7", along the y-axis in the +y-direction (relative to the intersection point 681). Each of the first electrical interconnection portion 680a and the second electrical interconnection portion 680b may extend along a part of a length (e.g., mid-length) of their respective side of the pixel numbered "7".

Further, using the pixel numbered "11", arranged adjacent (and below) the pixel numbered "7" as a further non-limiting example, the auxiliary metal line 604 of the pixel numbered "11" may include a first electrical interconnection portion (or first track portion) 682a and a second electrical interconnection portion (or second track portion) 682b intersecting each other at an intersection point 683. The first electrical interconnection portion 682a and the second electrical interconnection portion 682b may intersect at an upper left corner of the pixel numbered "11". The first electrical interconnection portion 682a and the second electrical interconnection portion 682b may intersect each other at least substantially perpendicular (90°) to each other. The first electrical interconnection portion 682a may extend along one side of the pixel numbered "11", along the x-axis in the +x-direction (relative to the intersection point 683), while the second electrical interconnection portion 682b may extend along another side (adjacent side) of the pixel numbered "11", along the y-axis in the −y-direction (relative to the intersection point 683). Each of the first electrical interconnection portion 682a and the second electrical interconnection portion 682b may extend along a part of a length (e.g., mid-length) of their respective side of the pixel numbered "11".

As may be observed, the neighbouring pixels numbered "7" and "11" may be of different orientations with respect to each other, where the respective auxiliary metal lines 604 of the neighbouring pixels numbered "7" and "11" may be arranged in different orientations with respect to each other.

For example, while the first electrical interconnection portions 680a, 682a may extend along the x-axis in the same direction (i.e., in the +x-direction), the second electrical interconnection portions 680b, 682b may extend in opposite directions (i.e., in the +y-direction for the pixel numbered "7" or the −y-direction for the pixel numbered "11"), along the y-axis.

It should be appreciated that each pixel as described herein may include a first electrical interconnection portion (or first track portion) and a second electrical interconnection portion (or second track portion) intersecting each other at an intersection point. Further, it should be appreciated that the descriptions above in the context of the auxiliary metal lines 604 (e.g., in terms of the first electrical interconnection portions 680a, 682a and the second electrical interconnection portions 680b, 682b) of the pixel numbered "7" and the pixel numbered "11" of the SiPM array/arrangement 700 may be applicable to each pixel as described herein, but with appropriate modifications depending on the arrangement or configuration of the auxiliary metal line 604 of the particular pixel as illustrated in the respective figures/drawings.

The connection correlation between the pixels 600 and the bonding pads 723 on the chip carrier 720 may be as shown in Table 1 below.

TABLE 1

| Pad # | Pixel # | Pad # | Pixel # | Pad # | Pixel # | Pad # | Pixel # | Pad # | Pixel # |
|---|---|---|---|---|---|---|---|---|---|
| T1 | 1 | L1 | 6 | R1 | 7 | B1 | 13 | TL | GND to ALL |
| T2 | 2 | L2 | 5 | R2 | 8 | B2 | 14 | TR | GND to ALL |
| T3 | 3 | L3 | 9 | R3 | 12 | B3 | 15 | BL | GND to ALL |
| T4 | 4 | L4 | 10 | R4 | 11 | B4 | 16 | BR | GND to ALL |

Figure 3:
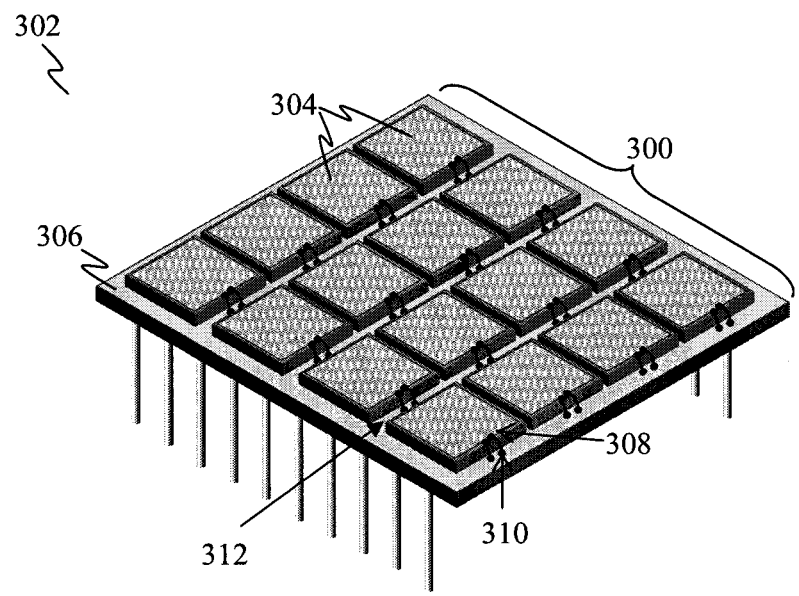
FIG. 3 a schematic perspective view of a 4×4 SiPM array.
Figure 4:
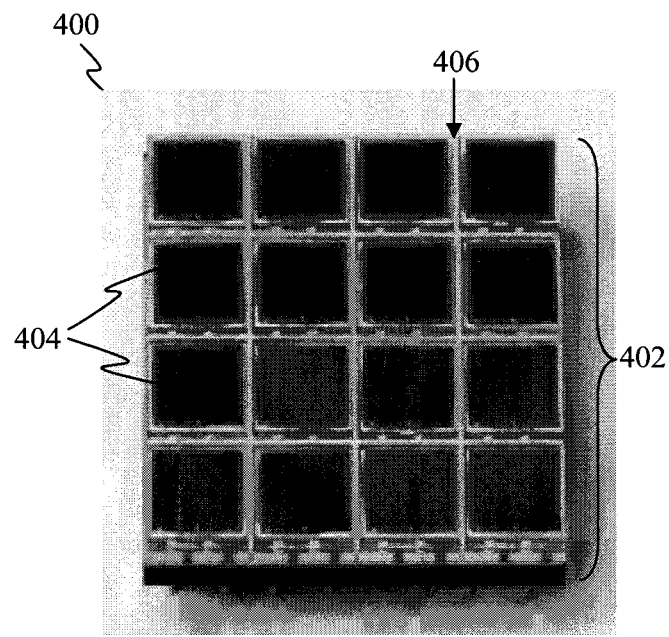
FIG. 4 shows an image illustrating a perspective view of an exemplary commercially available 4×4 SiPM array.

The SiPM array 700 as shown in FIG. 7C may be much more compactly tiled, in contrast to the conventional SiPM array 300 as shown in FIG. 3. As a result, higher tile fill factor and photon detection efficiency may be expected. It should be appreciated that such improvements may be attributed to the elimination of gaps between pixel dies needed for wire-bonding shown in FIG. 3. Furthermore, the difficulty for wire-bonding in the case for the SiPM array 700 of FIG. 7C may also be relieved since the up-and-down bonding operations in the narrow gaps (as required for the SiPM array 300 of FIG. 3) may be omitted.

Example II describes a 6×6 SiPM array, in accordance with one embodiment.

Figure 8:
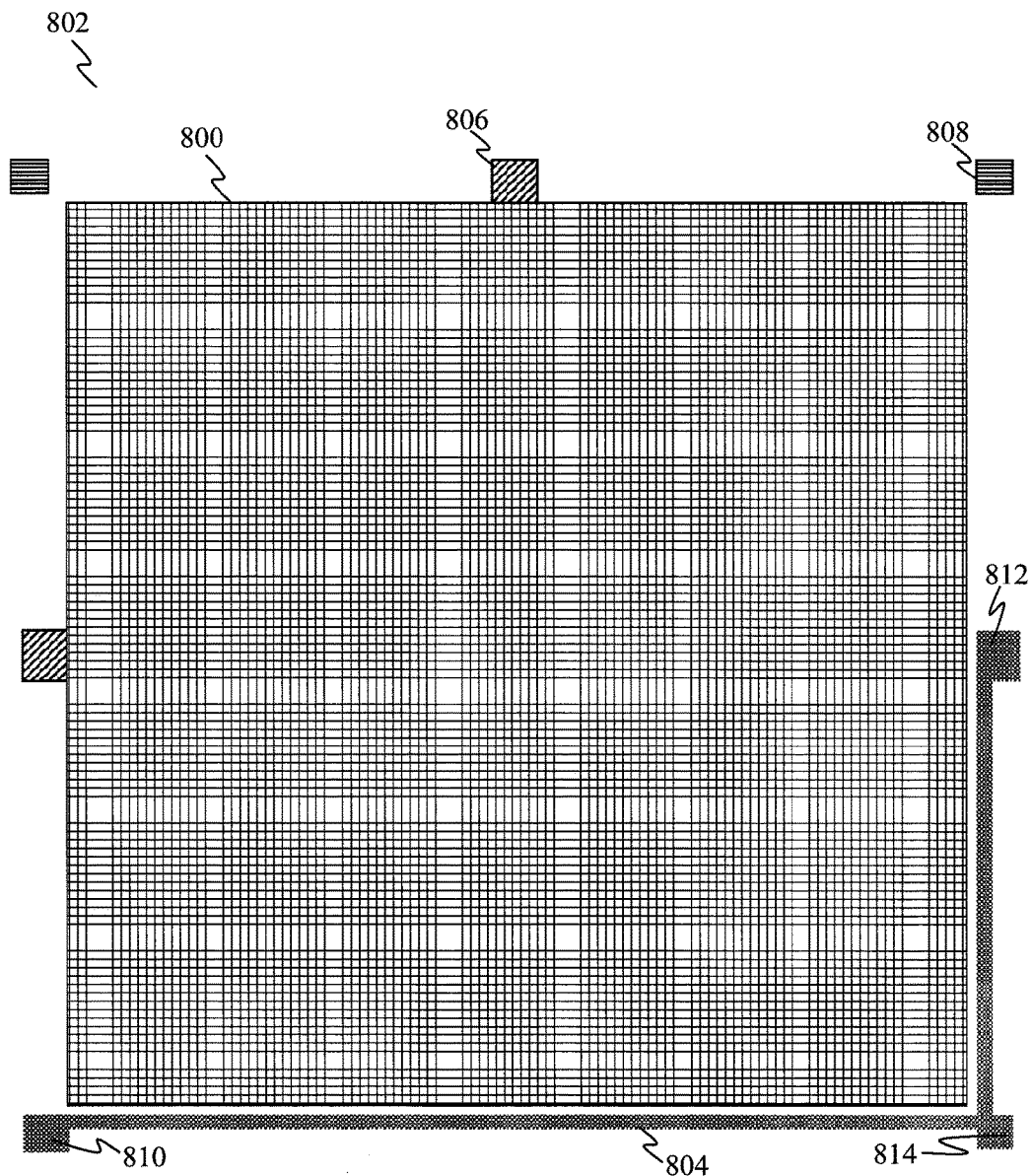
FIG. 8 shows a schematic top view of a SiPM pixel, according to one embodiment.

In Example II, a 6×6 SiPM array constructed by compactly tiled SiPM pixels may be achieved. FIG. 8 schematically shows a layout 802 of the SiPM pixel 800 to be used, where the auxiliary metal line 804 may be slightly different from the auxiliary metal line 604 shown in FIG. 6. For example, the auxiliary metal line 804 may extend along an entire side (length) of the SiPM pixel 800 between the bonding pads 810, 814, while the auxiliary metal line 804 may continue to extend mid-way along a side of the SiPM pixel 800 between the bonding pads 814, 812.

Nevertheless, similar to the SiPM pixel 600 of FIG. 6, more electrodes (both anodes 806 and cathodes 808) may be introduced for flexible connection of the SiPM pixel 800 of FIG. 8 with adjacent pixels.

The SiPM pixel 800 of FIG. 8 may include the same or like elements or components as those of a pixel 502 of the pixel arrangement 500 of FIG. 5A, and as such, the like elements may be as described in the context of the pixel 502 of FIG. 5A, and therefore the corresponding descriptions are omitted here. For example, the auxiliary metal line 804 may be described in the same or similar context with the electrical interconnection 508 of FIG. 5A. Further, it should be appreciated that the descriptions above in the context of the auxiliary metal lines 604 (e.g., in terms of the first electrical interconnection portions 680a, 682a and the second electrical interconnection portions 680b, 682b) of the pixel numbered "7" and the pixel numbered "11" of the SiPM array/arrangement 700 may be applicable to each SiPM pixel 800, but with appropriate modifications depending on the arrangement or configuration of the auxiliary metal line 804 of the particular pixel 800 as illustrated in the respective figures/drawings.

Figure 9A:
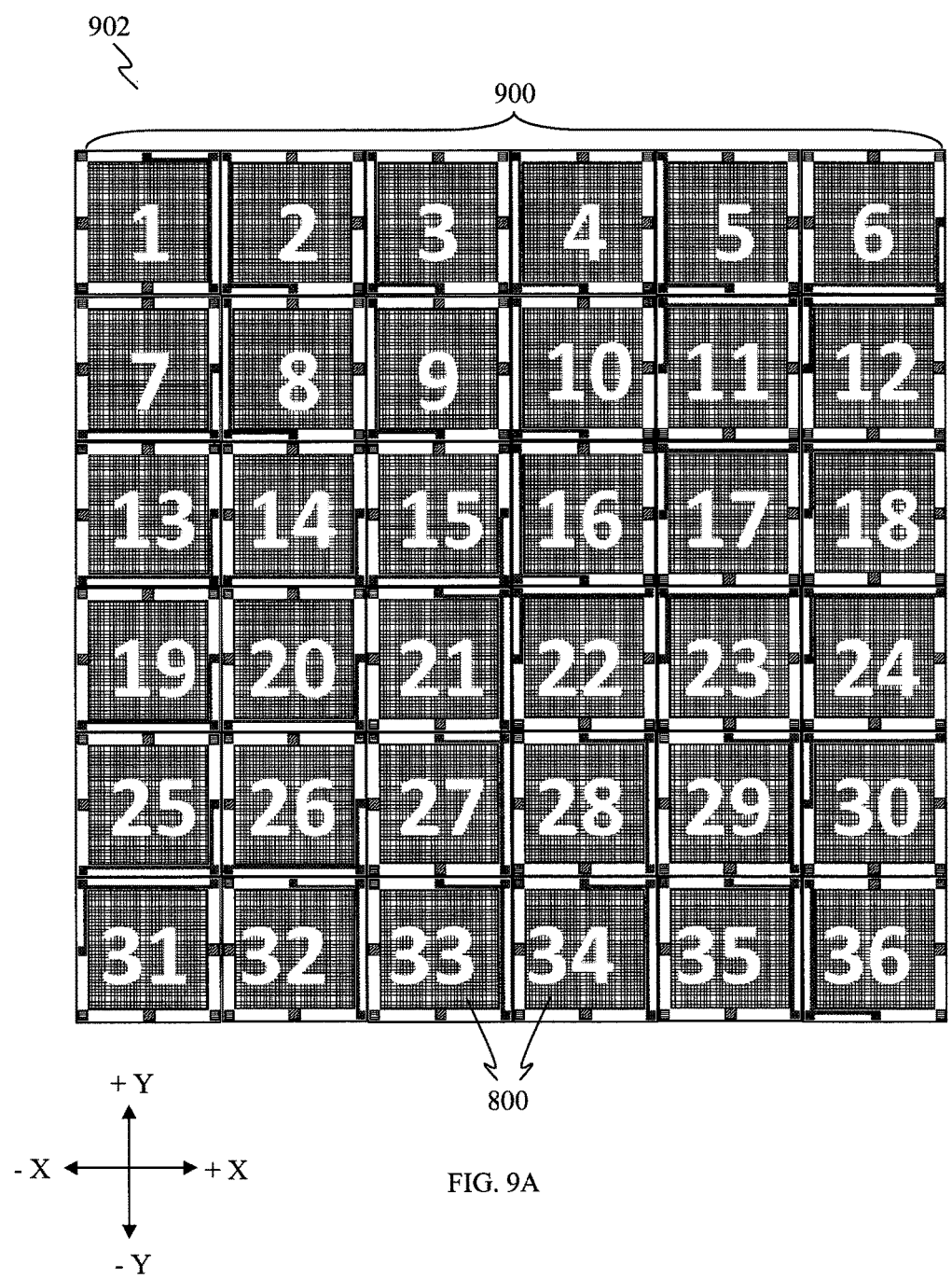
FIG. 9A shows a schematic top view of an arrangement of SiPM pixels of FIG. 8.

The different orientations of thirty-six pixels 800 in the 6×6 array 900 may be designed as shown in a layout 902 of FIG. 9A. As can be seen in FIG. 9A, twenty out of the thirty-six pixels (pixels numbered as "1" to "7", "12", "13", "18", "19", "24", "25", "30" to "36") are located along the edge of the array 900 and thus may be directly readout by wirebonding with the pads on a chip carrier (not shown in FIG. 9A). The rest of the sixteen pixels 800 (pixels numbered as "8" to "11", "14" to "17", "20" to "23", "26" to "29") may only be readout through the auxiliary metal lines 804 on adjacent pixels 800. All the pixels 800 in the array 900 have independent readout signals while sharing the same ground (GND).

Figure 9B:
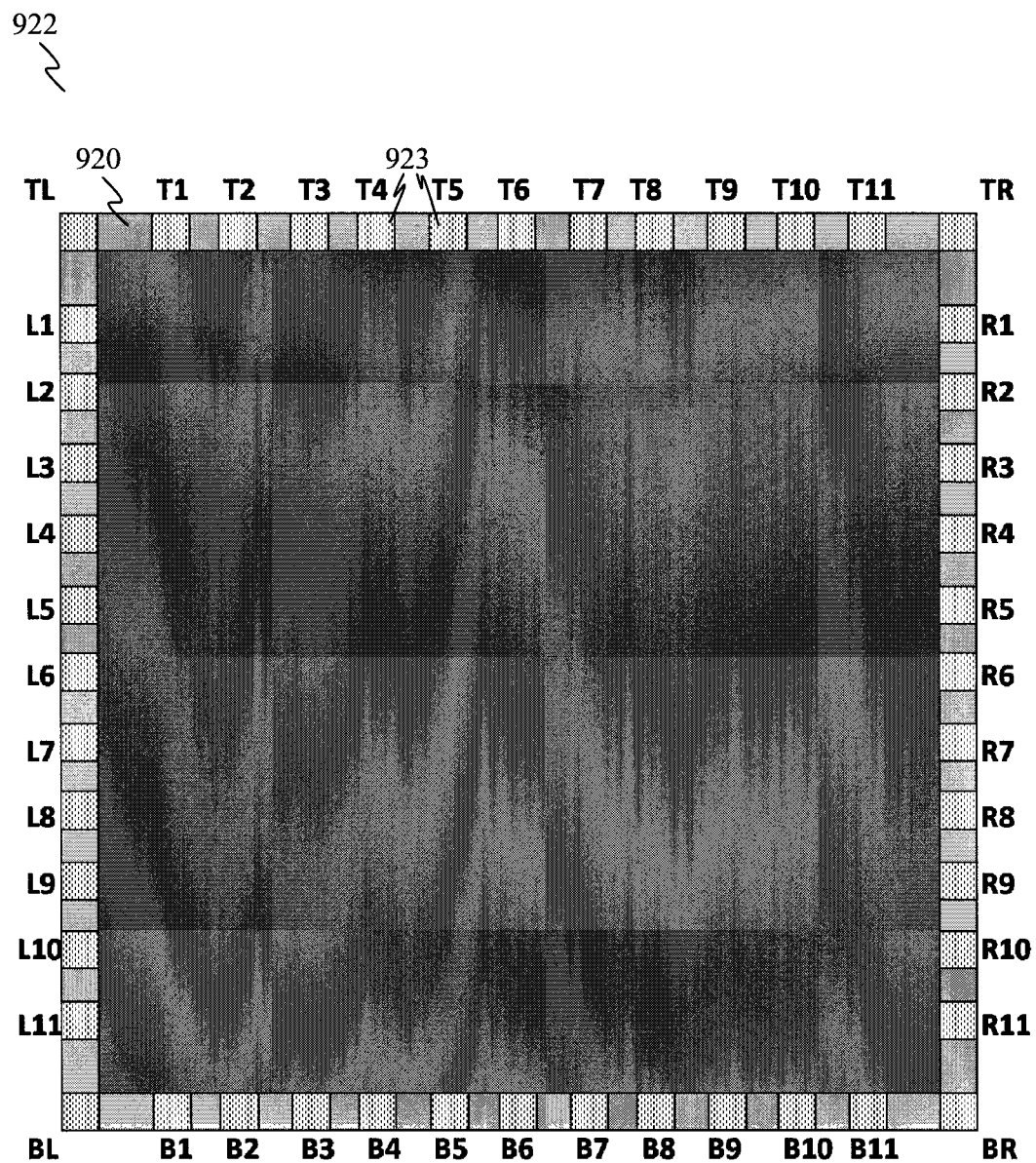
FIG. 9B shows a schematic top view of a chip carrier, according to one embodiment.

The output signals of the thirty-six pixels 800 may be read out by using a chip carrier 920 as shown a schematic top view 922 of FIG. 9B. As can be seen in FIG. 9B, totally forty-four bonding pads 923 (TL, T1-T11, TR, R1-R11, BR, B1-B11, BL, L1-L11) are used.

Figure 9C:
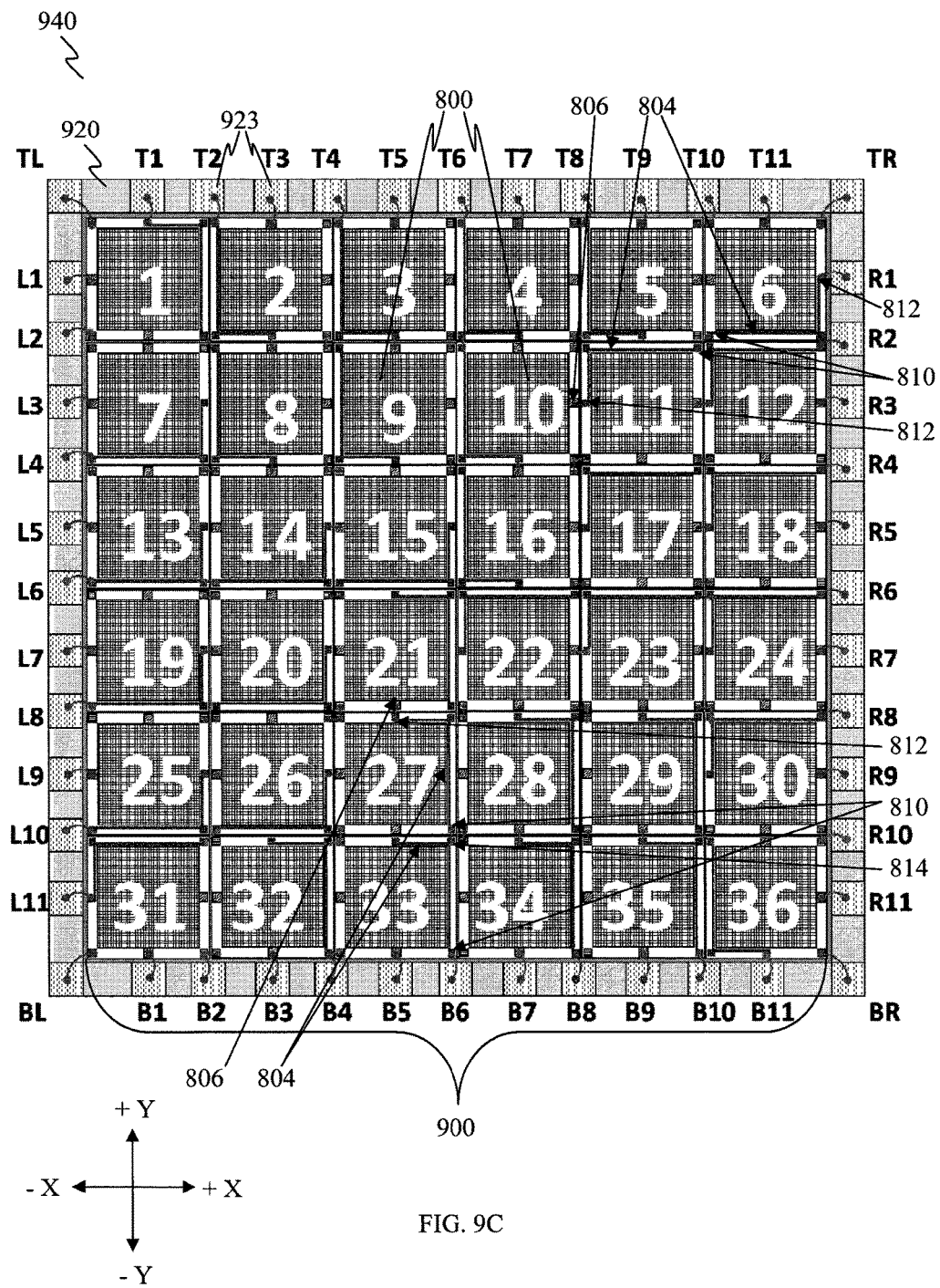
FIG. 9C shows a schematic top view of a packaged 6×6 SiPM array, according to one embodiment.

FIG. 9C shows a schematic top view 940 of the packaged 6×6 SiPM array 900 and the wire-bonding scheme. According to FIG. 9C, for example, the pixel numbered "10" may be connected to bonding pad 923 (R1). More specifically, the bonding pad of anode 806 of the pixel numbered "10" may be coupled using wire-bonding to the bonding pad 812 of the auxiliary metal line 804 of the pixel numbered "11", and the bonding pad 810 of the auxiliary metal line 804 of the pixel numbered "11" may be coupled using wire-bonding to the bonding pad 810 of the auxiliary metal line 804 of the pixel numbered "6", and the bonding pad 812 of the auxiliary metal line 804 of the pixel numbered "6" may be coupled using wire-bonding to the bonding pad 923 (R1) of the underlying chip carrier 920.

In another example, the pixel numbered "21" may be connected to bonding pad 923 (B6). More specifically, the bonding pad of anode 806 of the pixel numbered "21" may be coupled using wire-bonding to the bonding pad 812 of the auxiliary metal line 804 of the pixel numbered "27", and the bonding pad 810 of the auxiliary metal line 804 of the pixel numbered "27" may be coupled using wire-bonding to the bonding pad 814 of the auxiliary metal line 804 of the pixel numbered "33", and the bonding pad 810 of the auxiliary metal line 804 of the pixel numbered "33" may be coupled using wire-bonding to the bonding pad 923 (B6) of the underlying chip carrier 920.

The connection correlation between the pixels 800 and the bonding pads 923 on the chip carrier 920 may be as shown in Table 2 below.

TABLE 2

| Pad # | Pixel # | Pad # | Pixel # | Pad # | Pixel # | Pad # | Pixel # |
|---|---|---|---|---|---|---|---|
| T1 | 14 | L1 | 1 | R1 | 10 | B1 | 31 |
| T2 | 8 | L3 | 7 | R2 | 11 | B3 | 32 |
| T3 | 2 | L5 | 13 | R3 | 12 | B5 | 33 |
| T4 | 9 | L6 | 15 | R4 | 17 | B6 | 21 |
| T5 | 3 | L7 | 19 | R5 | 18 | B7 | 34 |
| T6 | 16 | L8 | 20 | R6 | 22 | B8 | 28 |
| T7 | 4 | L9 | 25 | R7 | 24 | B9 | 35 |
| T9 | 5 | L10 | 26 | R9 | 30 | B10 | 29 |
| T11 | 6 | L11 | 27 | R11 | 36 | B11 | 23 |
| T8 | GND to 4, 10, 11, 12, 16, 17, 18 | TL | GND to 1, 7 | | | | |
| T10 | GND to 5, 6 | L2 | GND to 1, 7 | | | | |
| TR | GND to 5, 6 | L4 | GND to 2, 3, 8, 9, 13, 14, 15 | | | | |
| R8 | GND to 22, 23, 24, 28, 29, 34, 35 | BL | GND to 31, 32 | | | | |
| R10 | GND to 30, 36 | B2 | GND to 31, 32 | | | | |
| BR | GND to 30, 36 | B4 | GND to 19, 20, 21, 25, 26, 27, 33 | | | | |

A compact SiPM array structure in accordance with various embodiments has been described. By introduction of auxiliary metal lines (e.g. auxiliary metal line 604 of FIG. 6 and auxiliary metal line 804 of FIG. 8) into the SiPM pixels 600, 800, the output of the pixels 600, 800 locating in the center of the respective array 700 (FIGS. 7A, 7C and 7D), 900 (FIGS. 9A and 9C) may be read out bypassing the respective auxiliary metal lines 604, 804 in adjacent pixels 600, 800. According to Examples I and II, the auxiliary metal lines 604, 804 may be equipped with at least two bonding pads 610, 612, 810, 812, 814, for the purpose of possible wire-bonding with other pads in adjacent pixels 600, 800 or in the SiPM array carrier (or chip carrier) 720 (FIGS. 7B and 7C), 920 (FIGS. 9B and 9C).

The width of the auxiliary metal line 604, 804 may be in the range of about 1 µm to about 10 µm. Too small a width may result in increased serial resistance, while too wide a width may take too much space of the pixel die 600, 800. The material of the auxiliary metal line 604, 804 may be any metal with low resistivity. Other electrically conductive materials, e.g., heavily doped poly-Si, may be used as well, as long as the resistivity of the material may be low enough and there is no compatibility issue in device fabrication and process integration.

By diligent design of the auxiliary metal line, the pixel layout, the bonding pads on the chip carrier, the orientation of each pixels, and the bonding schemes between pixels, both 4×4 and 6×6 SiPM arrays, in accordance with various embodiments, have been demonstrated, as described in Examples I and II. Since the inter-pixel wire-bonding may be processed on the surface of devices, less up-and-down wirebonding operation may be needed between the pixels and chip carrier. As a result, the bonding difficulty may be significantly alleviated. More importantly, no gap between adjacent pixels may be needed to accommodate the bonding pads and facilitate bonding operation. Thus, the SiPM pixels may be more compactly tiled. Therefore, higher tile fill factor and higher photon detection efficiency of the SiPM array may be expected.

As described above, various embodiments may provide an SiPM array with designed pixel orientations and wire-bonding schemes. Various embodiments may provide a compact tile of SiPM pixels.

In various embodiments, the pixel arrangement of various embodiments may enable responses of pixels in the array center to be read out bypassing the auxiliary metal lines in adjacent pixels. No up-and-down wire-bonding may be needed between pixels.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A pixel arrangement comprising:
a plurality of pixels arranged adjacent to each other; and
a substrate configured to receive the plurality of pixels,
wherein each pixel of the plurality of pixels comprises:
a plurality of optical cells electrically coupled to each other; and
an electrical interconnection electrically isolated from the plurality of optical cells, the electrical interconnection arranged to provide electrical communication between two separate conducting terminals external to the pixel; and wherein each pixel of the plurality of pixels and a neighbouring pixel of the plurality of pixels are of different orientations with respect to each other.

2. The pixel arrangement of claim 1, wherein for each pixel of the plurality of pixels, the electrical interconnection in entirety is arranged on the pixel.

3. The pixel arrangement of claim 1, wherein each pixel of the plurality of pixels further comprises a pixel substrate on which the plurality of optical cells are arranged.

4. The pixel arrangement of claim 3, wherein the electrical interconnection comprises a planar electrical interconnection arranged on the pixel substrate.

5. The pixel arrangement of claim 3, wherein the plurality of optical cells and the electrical interconnection are arranged on a same surface of the pixel substrate.

6. The pixel arrangement of claim 1, wherein the substrate comprises a chip carrier having at least one conducting pad.

7. The pixel arrangement of claim 6, wherein the electrical interconnection of one pixel of the plurality of pixels is electrically coupled to at least one of an electrical interconnection of another pixel of the plurality of pixels, or an electrode of another pixel of the plurality of pixels, or the at least one conducting pad of the chip carrier.

8. The pixel arrangement of claim 6, wherein the electrical interconnection of one pixel of the plurality of pixels is coupled using wire-bonding to at least one of an electrical interconnection of another pixel of the plurality of pixels, or an electrode of another pixel of the plurality of pixels, or the at least one conducting pad of the chip carrier.

9. The pixel arrangement of claim 1, wherein each pixel of the plurality of pixels comprises a polygon-shaped pixel.

10. The pixel arrangement of claim 9, wherein the electrical interconnection extends along at least two adjacent sides of the polygon-shaped pixel.

11. The pixel arrangement of claim 1, wherein each pixel of the plurality of pixels further comprises a first electrode electrically coupled to one end of each of the plurality of optical cells, and a second electrode electrically coupled to the opposite end of each of the plurality of optical cells.

12. The pixel arrangement of claim 11, wherein the first electrode and the second electrode are arranged away from the electrical interconnection.

13. The pixel arrangement of claim 1, wherein for each pixel of the plurality of pixels, the electrical interconnection is spaced apart from the plurality of optical cells.

14. The pixel arrangement of claim 1, wherein the electrical interconnection comprises at least two bonding pads.

15. The pixel arrangement of claim 1, wherein the plurality of optical cells are electrically coupled to each other in parallel.

16. The pixel arrangement of claim 1, wherein each of the plurality of optical cells comprises an avalanche photo diode (APD) and a quenching resistor.

17. The pixel arrangement of claim 1, wherein the plurality of pixels are in a side-by-side arrangement.

18. The pixel arrangement of claim 1, wherein each pixel of the plurality of pixels has at least one side in contact with at least one side of a neighbouring pixel of the plurality of pixels.

19. The pixel arrangement of claim 1, wherein each pixel of the plurality of pixels and a neighbouring pixel of the plurality of pixels are spaced apart from each other with a gap of less than 0.1 µm.

* * * * *